United States Patent

Lee et al.

[11] Patent Number: 5,849,370
[45] Date of Patent: Dec. 15, 1998

[54] METHOD FOR PRODUCING LOW SCATTER, LOW LOSS, ENVIRONMENTALLY STABLE DIELECTRIC COATINGS

[75] Inventors: Hakchu Lee; Ronald Kubota, both of San Jose; Larry Basegio, Soquel; Marc Kevin von Gunten, Los Altos, all of Calif.

[73] Assignee: Spectra-Physics Lasers, Inc., Mt. View, Calif.

[21] Appl. No.: 863,677

[22] Filed: May 27, 1997

Related U.S. Application Data

[63] Continuation of Ser. No. 423,645, Apr. 14, 1995, abandoned.
[51] Int. Cl.$^6$ ............... B05D 3/06; C23C 14/08
[52] U.S. Cl. ............ 427/562; 427/563; 427/564; 427/566; 427/567; 427/529
[58] Field of Search ............... 427/562, 563, 427/564, 570, 574, 567, 566, 529, 530

[56] References Cited

U.S. PATENT DOCUMENTS

| | | | |
|---|---|---|---|
| 4,201,798 | 5/1980 | Lindmayer et al. | 427/566 |
| 4,310,614 | 1/1982 | Connel et al. | 427/569 |
| 4,381,453 | 4/1983 | Cuomo et al. | 250/398 |
| 4,440,108 | 4/1984 | Little et al. | 427/571 |
| 4,490,229 | 12/1984 | Mirtich et al. | 204/192.11 |
| 4,541,890 | 9/1985 | Cuomo et al. | 204/298 |
| 4,617,192 | 10/1986 | Chin et al. | 427/596 |
| 4,634,600 | 1/1987 | Shimizu et al. | 427/562 |
| 4,652,795 | 3/1987 | Lee et al. | 315/111.41 |
| 4,759,948 | 7/1988 | Hashimoto et al. | 427/567 |
| 4,800,100 | 1/1989 | Herbots et al. | 427/529 |
| 4,877,504 | 10/1989 | Lee | 204/192.11 |
| 4,925,700 | 5/1990 | Brezoczky et al. | 427/529 |
| 4,948,626 | 8/1990 | Yasunaga et al. | 427/566 |
| 4,997,673 | 3/1991 | Ogata et al. | 427/566 |
| 5,053,245 | 10/1991 | Kiyama et al. | 427/566 |
| 5,098,736 | 3/1992 | Fukuda | 427/529 |
| 5,227,363 | 7/1993 | Furukawa et al. | 427/564 |
| 5,240,583 | 8/1993 | Ahonen | 204/298.04 |
| 5,274,661 | 12/1993 | von Gunten et al. | 372/99 |
| 5,340,607 | 8/1994 | Friz et al. | 427/566 |
| 5,415,756 | 5/1995 | Wolfe et al. | 427/563 |
| 5,597,622 | 1/1997 | Zöller et al. | 427/567 |

OTHER PUBLICATIONS

Becker, J., *Handbook of Optical Properties*, vol. 1, Thin Films, chp. 7 p. 209 no date provided.
MaCleod, H.A. *Thin Film Optical Filters* 1969 (no month) p. 298.

*Primary Examiner*—Marianne Padgett
*Attorney, Agent, or Firm*—Wilson, Sonsini, Goodrich & Rosati

[57] ABSTRACT

A method for creating a dielectric coating on a substrate produces near bulk density metal oxide coatings with extremely low surface roughness, microstructure and low defect density. The coatings have a low scatter of less than 50 ppm, low loss of less than 100 ppm, and an environmental stability of 0.1 or less spectral shift. A high vacuum chamber is provided which includes a substrate carrier device, an electron beam gun, a substrate, an evaporant source of coating material, a plasma bridge neutralizer and an ion gun. Coating material is evaporated with the electron beam gun to form a coating material evaporant that is directed to the substrate. An ion gun is directed toward the substrate and produces ions that arrive substantially simultaneously with the coating material evaporant at the substrate. The ions provide a momentum assist to the coating material. The result is a formation of a desirable dielectric thin film of coating material on the substrate.

40 Claims, 7 Drawing Sheets

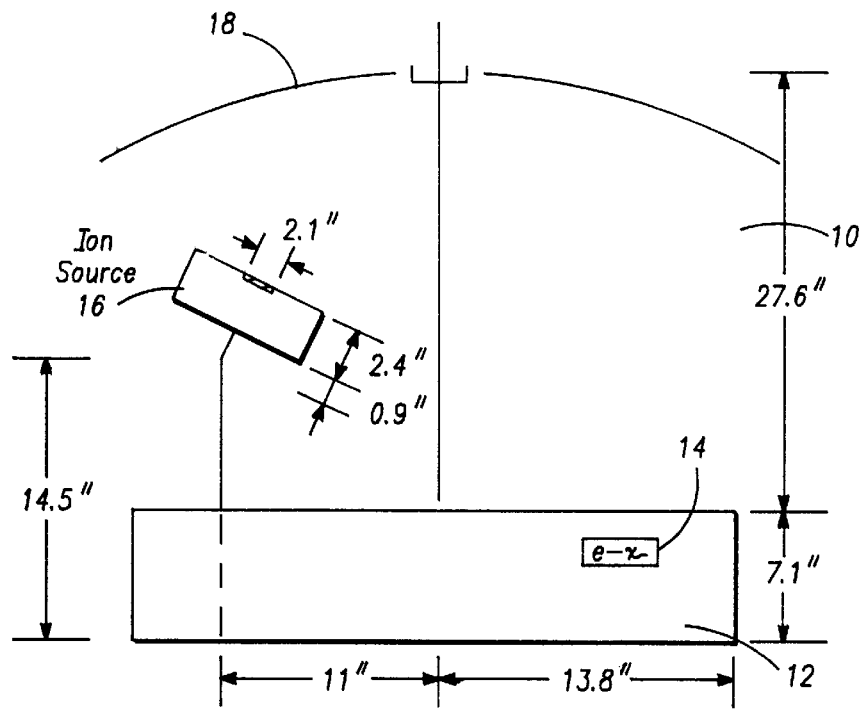
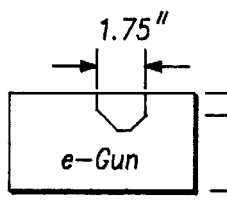
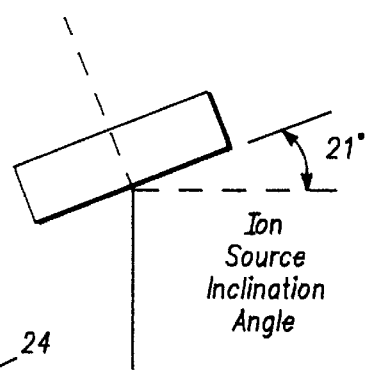
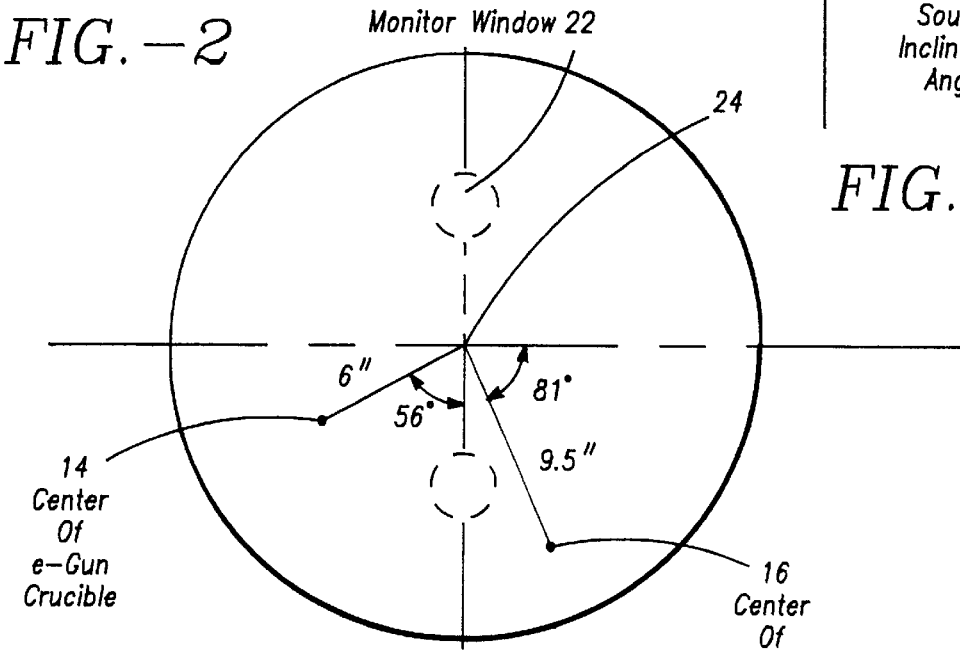
FIG.-1
FIG.-2
FIG.-3
FIG.-4

REFRACTIVE INDEX AS A FUNCTION OF
DEPOSITION RATE:

— $Ta_2O_5$ — Evap: Ion

| RATE @ 550 nm | EVAPORANT FLUX | Ion FLUX | RATIO | REFRACTIVE INDEX |
|---|---|---|---|---|
| 3 MIN. | $4.4 \times 10^{14}$ MOLEC./s. cm² | NO Ions | N/A | 2.05 |
| 10 MIN. | $1.3 \times 10^{14}$ MOLEC./s. cm² | $5.4 \times 10^{14}$ MOLEC./s. cm² | 1:4.2 | 2.12 |
| 25 MIN. | $4.9 \times 10^{13}$ MOLEC./s. cm² | \\ | 1:1.1 | 2.20 |

FIG.—5

— $TaO_2$ — Evap: Ion

| RATE @ 550 nm | EVAPORANT FLUX | Ion FLUX | RATIO | REFRACTIVE INDEX |
|---|---|---|---|---|
| 5 MIN. | $5.7 \times 10^{14}$ MOLEC./s. cm² | $5.4 \times 10^{14}$ MOLEC./s. cm² | ~ 1.1 | 2.50 |
| 9 MIN. | $3.2 \times 10^{14}$ MOLEC./s. cm² | \\ | 1:1.7 | 2.57 |
| 25 MIN. | $1.1 \times 10^{14}$ MOLEC./s. cm² | \\ | 1:4.9 | 2.65 |

COATING TEMPERATURE: 200 c
Ion SPECIES: OXYGEN
Ion ENERGY: ~ 550eV (PLASMA ENERGY INSIDE Ion SOURCE)

FIG.—6

Ion SOURCE SCHEMATIC DIAGRAM

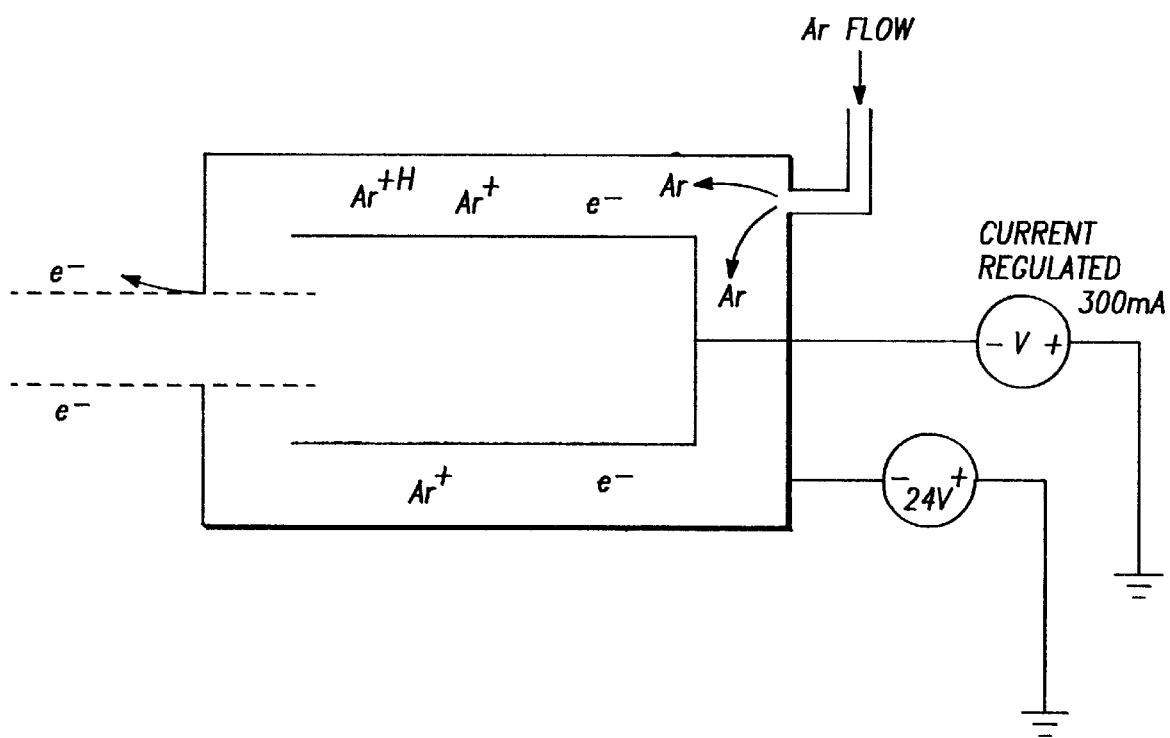
FIG.—10

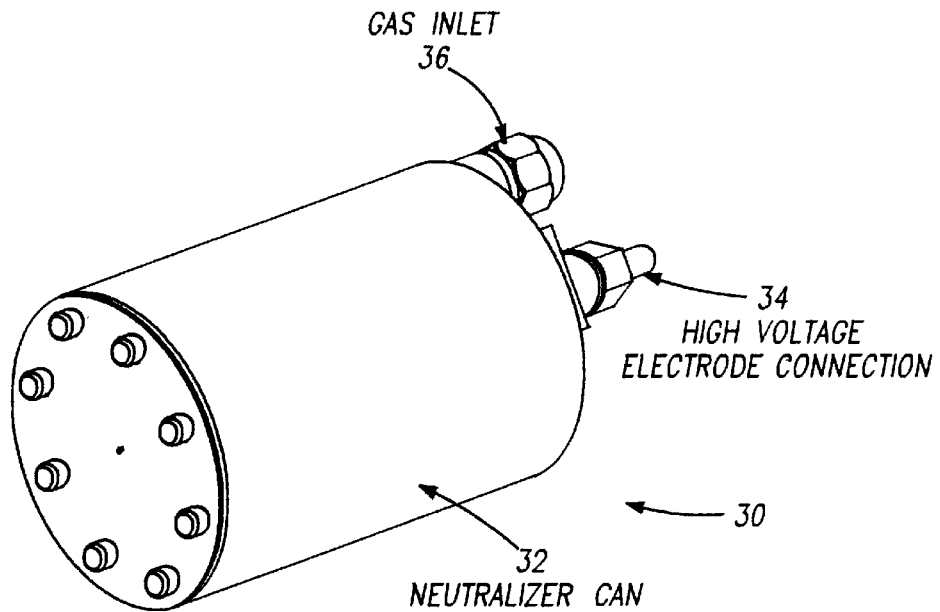
FIG.—11
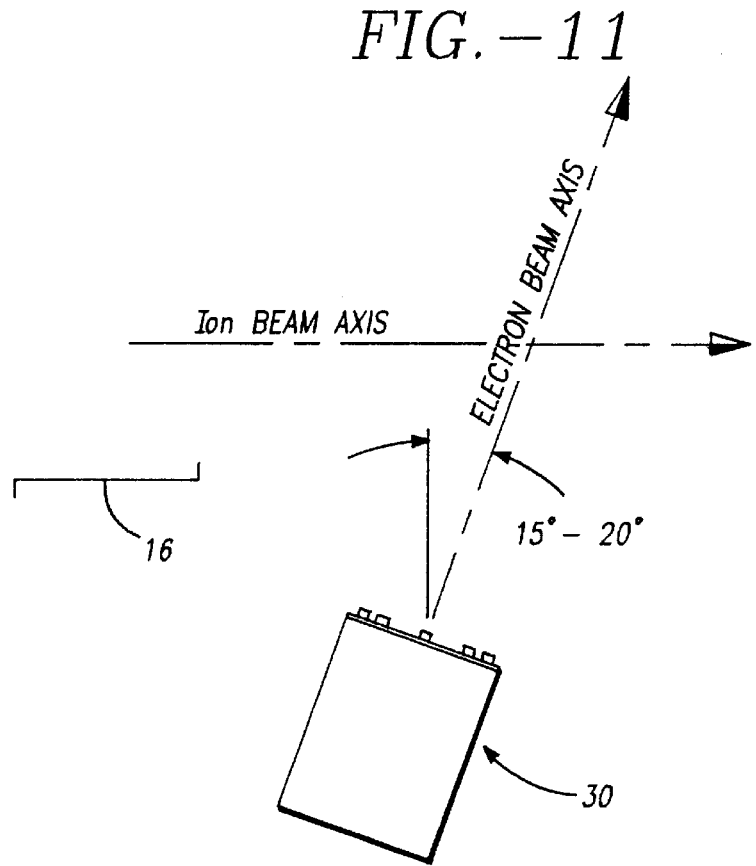
FIG.—12

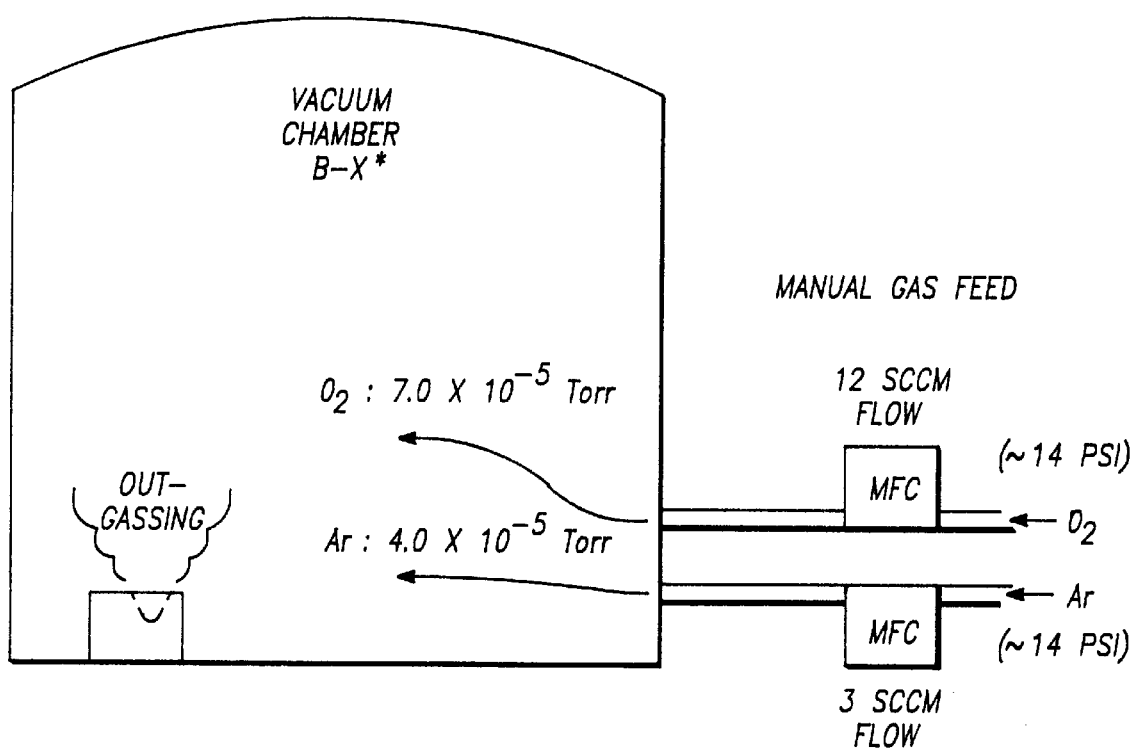
FIG.−13

METHOD FOR PRODUCING LOW SCATTER, LOW LOSS, ENVIRONMENTALLY STABLE DIELECTRIC COATINGS

This application is a continuation of application Ser. No. 08/423,645, filed Apr. 14, 1995 now abandoned.

BACKGROUND OF THE INVENTION

1. Field of the Invention

This invention relates generally to the formation of dielectric thin films on a substrate, and more particularly to a method for producing thin films on a substrate utilizing an electron beam gun to create evaporated coating molecules that are deposited on a selected substrate, an ion source, and a plasma neutralizer, wherein ions and evaporated coating material arrive substantially at the same time at the substrate, forming a low scatter, low loss, near bulk density dielectric thin film coating with relatively low surface roughness, and a microstructure with low defect density.

2. Description of the Related Art

The traditional method of fabricating dielectric thin films on selected substrates have been the utilization of an electron beam evaporation method. Such a method utilizes a substrate on which a thin layer coating is applied, with the substrate positioned inside of a vacuum chamber, along with a sample of the bulk or target material that is deposited. An electron beam focussed on the sample material causes localized heating of the material to a point where molecules are evaporated off. These molecules then condense on the other surfaces located in the interior of the vacuum chamber, including the substrate which is being coated.

An electron beam has been utilized because of its capability of transferring sufficient thermal energy to a localized area of the target material. The kinetic energy of the electrons in the beam are converted to thermal energy when the beam is directed at the evaporate material. Molecules of the target material are heated to the point where molecules or grouped molecules are boiled off. This process of electron beam evaporation as a method of coating is thoroughly explained in, "Physical Vapor Deposition," distributed by Airco Temescal, 2850 Seventh Street, Berkeley, Calif., 1976.

One of the principle problems encountered in the electron beam evaporation technique is to coat layers so they approach the density of the bulk material from which they come. With this process, molecules of the target material condense on the substrate in such a manner that voids, pores and holes are left between them. The resulting coating is less dense than the bulk, which results in a difference in the layers index of a refraction. Because of the unpredictability of the final density, it is difficult to determine and to control the refractive indexes of the stack.

Another problem with the electron beam technique is encountering impurities or air pockets in the target material. The high heat concentration results in small explosions which throw larger chunks of coating materials throughout the chamber that represent impurities which condense in the layer. These impurities increase point or defect scatter and absorption.

With the electron beam evaporation technique, parameters including temperature of the substrate, partial pressure of oxygen in the chamber, rate of deposition, and preparation of the target material are varied attempts to control and improve the oxidation state, packing density, and degree of amorphousness of the layers. Generally, determining the proper variations and controlling them has proven difficult. Typically, the temperature of the substrate must be maintained at about 300 degrees centigrade. However, the energy of the electron beam evaporant is about 0.1 eV, and high packing density of the coating material on the substrate is not achieved.

More recently, a method for fabricating multilayer optical films has been reported in U.S. Reissue No. 32,849. In the '849 patent, an ion gun is utilized and directed to strike target material. The energy of the ion gun is about 500–1000 eV, and the energy of the evaporant is about 10 eV. The result is dielectric thin film formation with low scatter, low loss, and dense films.

However, the system for achieving this result is relatively expensive. Further, this method requires critical alignment and geometry which can be difficult to achieve.

Accordingly, there is a need to achieve a method for creating dielectric thin films on substrates with low scatter, low loss, and dense films that is economically suitable for retrofitting existing systems. Further, there is a need for such a method to which an electron beam gun produces evaporant coating material that encounters ions which transfer momentum to the coating material substantially on the substrate.

SUMMARY OF THE INVENTION

Accordingly, the present invention provides a method for forming dielectric thin films on substrates that have low scatter.

Another object of the invention is to provide a method for forming dielectric thin films on a substrate with low loss.

Yet another object of the invention is to provide a method for forming dielectric thin films on a substrate with a spectral shift of 0.1 percent or less.

A further object of the invention is to provide a method for forming dielectric thin films on a substrate that are highly dense, near bulk value, and a microstructure that has minimal voids or holes.

Still a further object of the invention is to provide a method for forming dielectric thin films on a substrate which are environmentally stable.

Yet another object of the invention is to provide for forming dielectric thin films on a substrate while maintaining extremely low surface roughness values over a large number of layers, and over a range of layers thicknesses.

Another object of the present invention is to provide a method for forming dielectric thin films on a substrate that are highly efficient oxygenation of a metal oxide dielectric thin film deposition.

A further object of the invention is to provide a method for forming dielectric thin films on a substrate that employs a plasma bridge neutralizer.

Still a further object of the invention is to provide a method for forming dielectric thin films on a substrate at a slow rate of deposition to allow a desired arrival rate of ions and evaporant coating substantially simultaneously at the substrate surface.

Another object of the invention is to provide a method for forming dielectric thin films on a substrate with a maintainable arrival rate of ions and evaporant coating material.

Yet another object of the invention is to provide a method for forming dielectric thin films on a substrate which utilizes a momentum transfer from oxygen ions to the evaporant coating material.

These and other objects of the invention are achieved in a method for creating an dielectric coating on a substrate. The method provides a high pressure vacuum chamber including a substrate carrier device, an electron beam gun, a substrate, and an evaporant source of coating material, a plasma neutralizer and an ion gun. Coating material is evaporated with the electron beam gun and forms a coating material evaporant that is directed towards the substrate positioned on the substrate carrier. The ion gun is directed toward the substrate and produces ions that arrive substantially simultaneously with the coating material evaporant at the substrate surface. The ions provide a momentum assist to the coating material. A dielectric thin film coating is then formed on the substrate.

In another embodiment, the method provides a high vacuum chamber including a substrate carrier device, an electron beam gun, a substrate, an evaporant source of coating material, a plasma beam neutralizer and an ion gun producing positively charged particles along a longitudinal axis of the ion gun. The plasma beam neutralizer is positioned adjacent to and in a lateral direction relative to the ion gun longitudinal axis. Electrons are generated from the plasma beam neutralizer which mix with the positively charged particles along the longitudinal axis of the ion gun at the exterior of the ion gun, producing a beam of flowing plasma. Coating material in the electron beam gun is evaporated and forms a coating material evaporant that is directed to the substrate. The beam of flowing plasma provides a momentum assist to the coating material evaporate. A dielectric thin film of coating material is then formed on the substrate.

A plurality of dielectric thin films of the coating material are formed on the substrate. The stoichiometry of the coating material layers formed on the substrate are controlled. The ion/coating material evaporant arrival ratio at the substrate is controlled to create a desired density of coating material dielectric thin film layers. Further, the ions are utilized in order to increase the energy of the coating material deposited as layers on the substrate.

In one embodiment of the invention, the energy of the coating material deposited as layers on the substrate is greater than five eV, preferably greater than 7.5 eV, still more preferably greater than 9.0 eV, and still more preferably, 10.0 eV or greater.

The electron beam gun provides the evaporant flux which is deposited on substrates positioned in the carrier. A uniform flux is applied substantially under a carrier of a high vacuum evaporant chamber. The dielectric thin film coatings have low scatter of about less than 50 ppm, low loss of about less than 100 ppm, and a spectral shift of 0.1 percent or less.

The method of the present invention provides high energy coating molecules at the substrate level. For example, when the coating is metal oxide, the present invention provides near "fluid motion" for the evaporated molecules during film formation. The initial fluid motion of monolayers, however, does not continue for a very long time since the substrate acts as a heat sink and causes the molecules to freeze in place. In this energetic fluid motion process, filling of voids occurs in microstructures and coating surfaces are smooth.

With the present invention, an electron beam gun is utilized to evaporate metal oxide, metal fluroide, metal carbide and metal nitride targets including but not limited to tantala, zirconia, hafnia, titania and silica of varying oxidation states. The evaporated target molecules subsequently condense and coalesce on a preheated, approximately 200 degrees centigrade, substrate surface. At the initial stages of evaporation, e.g., at the target level, the energy of the coating molecules is approximately 0.1 eV. However, at the substrate level, the energy of the coating vapor is boosted to about 10 eV. This energy is transferred or imparted to the coating molecules via a collisional process with energetic oxygen ions, of specified energy and flux, at the substrate level where the dielectric thin film microstructures take form. In this method, a key parameter is the ion/evaporant molecule arrival ratio which determines the density of the growing film.

The present invention further provides for ion beam neutralization. This is also referred to as space/charge neutralization. In space/charge neutralization, free electrons are allowed to mix with molecular ions without being captured by the electronic shell of the ions. Thus, the injection of free electrons into the ion beam in essence produces a beam of flowing plasma.

BRIEF DESCRIPTION OF THE FIGURES

FIG. 1 is a cross-sectional view of the high vacuum chamber utilized with the method of the present invention.

FIG. 2 is a cross-sectional view of the electron beam gun utilized with the method of the present invention, including relative dimensions.

FIG. 3 is an illustration of the ion source inclination angle.

FIG. 4 is a cross-sectional downward view from the top of the high vacuum chamber in the present invention.

FIG. 5 is a table of the refractive index as a function of deposition rate for $Ta_2O_5$.

FIG. 6 is a table of the refractive index as a function of deposition rate table for $TiO_2$.

FIG. 10 is a schematic diagram of the neutralizer.

FIG. 11 is a perspective view of the cold cathode plasma bridge neutralizer of the present invention.

FIG. 12 illustrates the relative position of the plasma bridge source in the cold cathode ion source.

FIG. 13 is a schematic diagram illustrating the vacuum chamber with oxygen and argon gas feeds.

DETAILED DESCRIPTION

Figure 7:
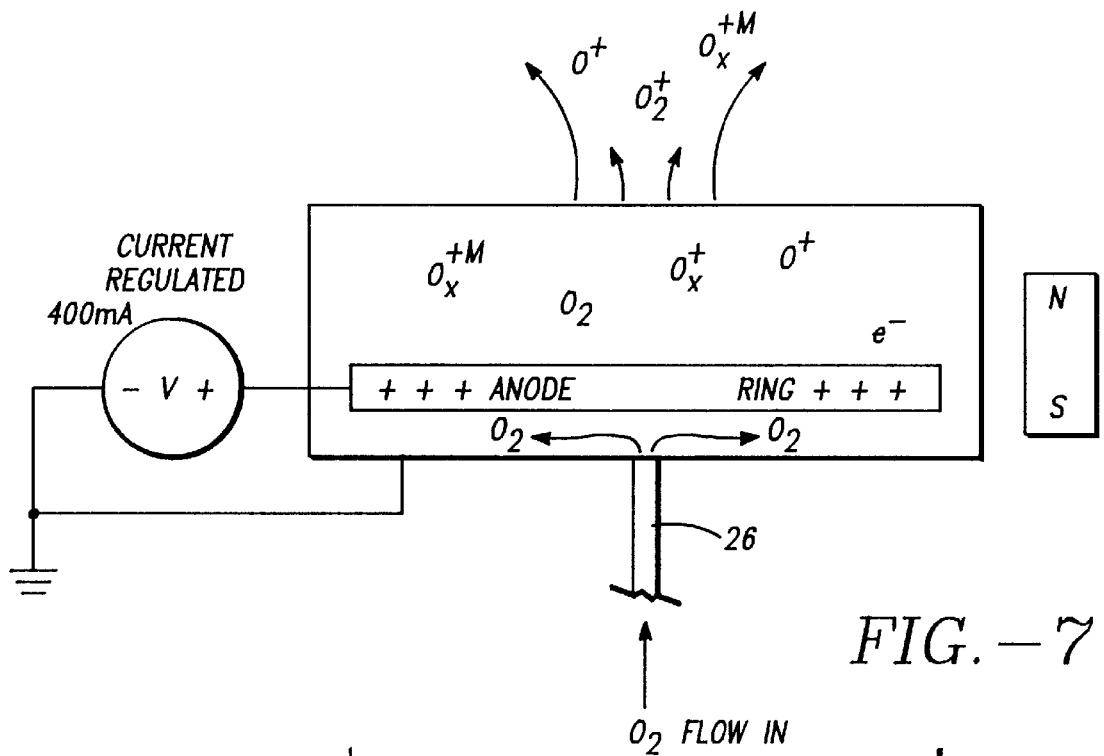
FIG. 7 is a schematic drawing of an ion source suitable for use with the method of the present invention.
Figure 8:
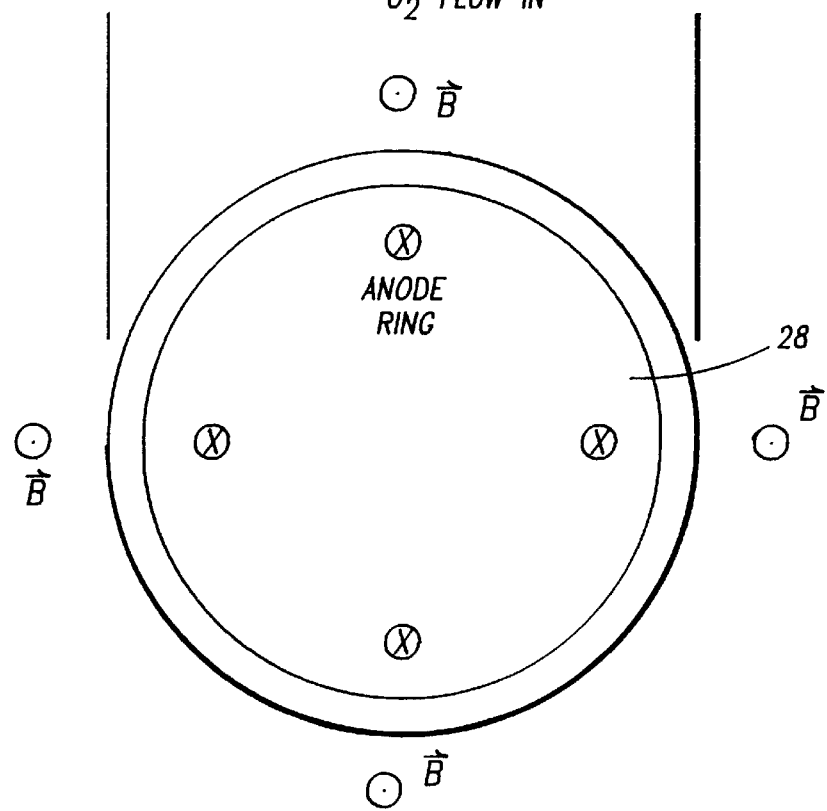
FIG. 8 is a schematic diagram of an anode ring used in the ion source of the present invention.
Figure 9:
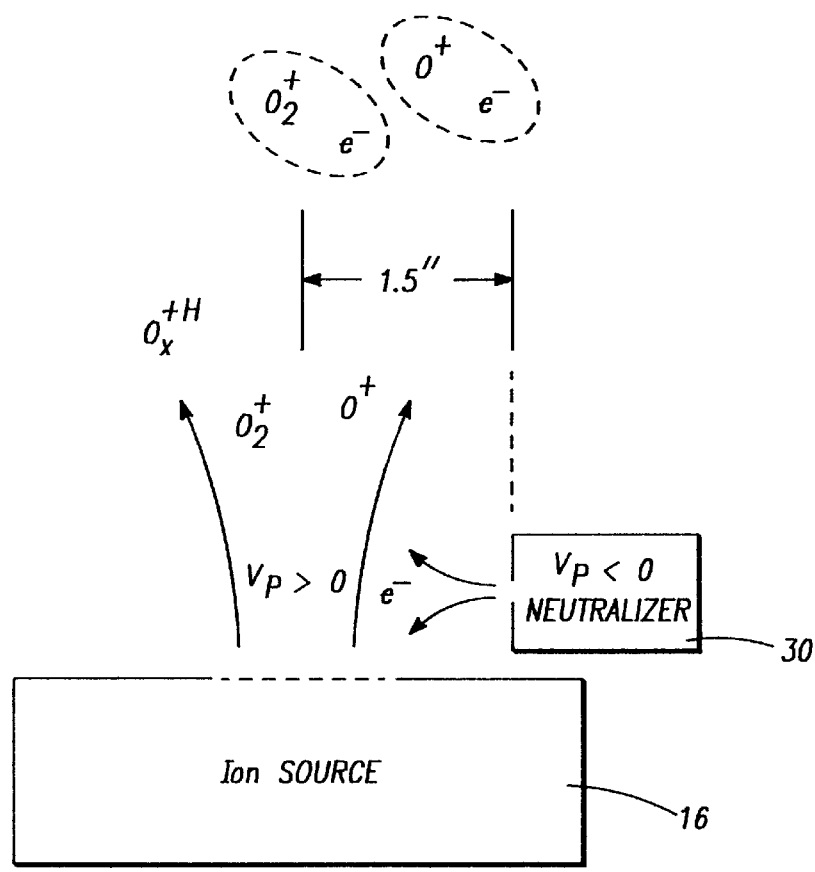
FIG. 9 is a schematic diagram of the ion source in the neutralizer suitable for use with the present invention.

The present invention provides a method for creating an dielectric coating on a selected substrate within a high vacuum chamber. A high vacuum chamber is utilized and includes a substrate carrier, an electron beam gun, a substrate positioned in one of the carrier elements, an evaporant source of coating material that serves to create the thin layers on a substrate, a plasma beam neutralizer and an ion gun. The coating material is evaporated with the electron beam gun and forms a coating material evaporant that is directed towards the carrier, and more particularly, to the individual substrates in the carrier. The ion gun is also directed toward the substrate and produces ions that arrive substantially simultaneously with the coating material evaporant at the substrate. The ions provide a momentum assist to the coating material. Finally, a dielectric thin film, such as a multilayer stack, of various thicknesses, is then formed on the substrate.

Further, the method provides a high vacuum chamber including, a substrate carrier device, an electron beam gun, a substrate, an evaporant source of coating material, a plasma beam neutralizer and an ion gun producing positively charged particles along a longitudinal axis of the ion gun. The plasma beam neutralizer is positioned adjacent to and in a lateral direction relative to the ion gun longitudinal axis. Electrons are generated from the plasma beam neutralizer which are mixed with the positively charged particles. Multiple layers can be formed, including but not limited to layers of different materials, i.e., alternating layers. More than 50 layers can be formed. The dielectric coating has a low surface roughness of less than 5 Å RMS when deposited on a substrate of less than 2 Å RMS. Further, the dielectric coating is near bulk density or bulk density which means 0.95 or greater. It will be appreciated that the dielectric coating can be an optical coating.

Referring now to FIGS. 1–4, a vacuum chamber 10 is provided. Disposed within vacuum chamber 10 is a base plate, 12, in which an electron beam gun, 14, is positioned. In one embodiment of the invention, the electron beam gun has an crucible pocket of about 1.75 inches in width, it is positioned above base plate 12, 5 ⅛ inches, and is approximately ½ inches in depth. The crucible pocket houses the evaporant coating material. Suitable coating materials include metal oxides, metal fluorides, metal carbides and metal nitrides. Exemplary coating materials include but are not limited to $SiO_2$, $HfO_2$, $Ta_2O_5$, $ZrO_2$, $TiO_2$, $SiO_2$, $HfO_2$, $Ta_2O_5$, $ZrO_2$, $TiO_2$, $Nb_2O_5$, $Y_2O_3$, $Al_2O_3$, $Se_2O_3$, $BeO$, $Gd_2O$, $AlF_3$, $MgF_2$, $ThF_4$, $HfF_4$, $YbF_3$ and $YF_3$. Evaporated target molecules are caused to condense and coalesce on a preheated, 200 degree Centigrade, substrate surface. At the initial stages of evaporation, e.g., at the target level, the energy of the coating molecules is approximately 0.1 eV. At the substrate level the energy of the coating vapor is boosted to 5 eV or greater, preferably 7.5 or greater, still more preferably 9.0 or greater, and most preferably about 10 eV. This energy is transferred or imparted to the coating molecules via a collisional process with energetic oxygen ions, of specific energy and flux, on the substrate where the dielectric thin film microstructures take form. A key parameter for this process is the ion/evaporant molecule arrival ratio which determines the density of the going film, as illustrated in FIGS. 5 and 6, for $Ta_2O_5$, and $TiO_2$, respectively.

In the case of $Ta_2O_5$, a time period for deposition was 3 minutes, 10 minutes, and 25 minutes. The evaporant flux was $4.4 \times 10^{14}$ molecules per s $cm^2$, $1.3 \times 10^4$ molecules/s $cm^2$ and $4.9 \times 10^{13}$ molecules/s $cm^2$, respectfully; the ion flux at 3 minutes was zero ions, at 10 minutes it was $5.4 \times 10^{14}$ molecules/s $cm^2$, and at 25 minutes, $5.4 \times 10^{14}$ molecules/s $cm^2$. The evaporation:ion ratio at 10 minutes was 1:4.2, and at 25 minutes 1:1.1. Refractive indexes were measured at 3 minutes at 2.05, 2.12 at 10 minutes, and 2.20 at 25 minutes. The coating temperature was at 200 degrees C., the ions species was oxygen and the ion energy was approximately 550 eV, e.g., the plasma energy inside of the ion source. FIG. 6 has similar data for $TiO_2$. Again, this emphasizes the significance of the rate of ion:evaporant molecule arrival ratio. The proper ratio is required in order to achieve a highly dense, nearly bulk value, and microstructure with the concaminont effect being very high and an environmentally stable refractive index. The coatings deposited maintain extremely low surface roughness values over a large number of layers, and over a range of layer thicknesses. Additional characteristics include the high efficient oxygenation of the metal oxide dielectric thin film during deposition. This is a consequence of the high oxygen ion:evaporant molecule arrival ratio from the coating process. Further, a very good adhesion of the coating is achieved on the substrate. These features combine with the method's inherent generation of low defect density, yields dielectric coatings with total losses of less than 100 ppm at 633 nm, as coated on superpolished substrates of less than 1 Å RMS. Near bulk density metal oxide coatings with low scatter, less than 50 ppm, low loss, less than 100 ppm, environmentally stable, less than 0.1 percent spectral shift, are achieved.

Referring again to FIGS. 1–4, a specific embodiment of the invention is disclosed. As shown in FIG. 1, selected dimensions are suggested, but those skilled in the art will appreciate that the present invention is not limited to the dimensions stated in FIG. 1. As shown in FIG. 1, electron beam gun 14 is positioned in base plate 12 within vacuum chamber 10. Ion source 16 is positioned closer to dome 18 of vacuum chamber 10. A carrier 20 is positioned adjacent to dome 18, and includes a plurality of carrier elements to hold and maintain a plurality of substrates to be coated. As shown in FIG. 2, dimensions of the electron beam gun 14 are illustrated. In FIG. 3, a 21 degree ion source inclination angle is shown. Ion source 16 is tilted in order to achieve the proper coverage for the substrates. Further, in FIG. 4 a monitor window, 22, permits viewing and monitoring of the process. A specific embodiment is illustrated in FIG. 4 wherein the center of electron beam gun crucible 14 is illustrated relative to the center of ion source 16. The point of intersection of the ions and evaporant is at a point 24. One will appreciated that the point of interaction between the ions and coating molecule evaporant is at the substrate level. The interaction of the two does not occur prior to interaction at the substrate level in order to maintain the desired momentum transfer. Therefore, it is important to maintain the total chamber pressure to about $1.0 \times 10_{-4}$ during deposition.

Referring now to FIG. 7, ion source 16 includes an oxygen flow channel 26 which introduces oxygen within an interior of ion source 16. Ion source 16 includes an anode ring 28 which is connected to a current source that is regulated. In one embodiment of invention, 400 mA are delivered to anode ring 28.

For purposes of the present invention, an ion neutralizer 30 is associated with ion source 16. The oxygen ion beam utilized to impart energy to the growing dielectric thin film is generated and extracted from a cold cathode ion source such as model cc-102r, available from Danton Vacuum. Oxygen ions are generated when neutral oxygen gas is injected into a region of strong static electric field. In the region of strong electric field, outermost electrons are stripped from neutral diatomic oxygen producing ionized monatomic and diatomic oxygen. This region consists of neutrals, ions and electrons, generally referred to as a glow discharge or plasma, and immersed in a strong, static magnetic field of about 3000 Gauss. The magnetic field serves the purpose of creating a helical-type motion path for the electrons. This increases its collisional cross-section with neutral oxygen gas. Ion source 16 voltage utilized for plasma generation can be about 550 volts +/-10 percent, at an oxygen injection rate of about 12 sccm (or calibrated chamber pressure of approximately $7.0 \times 10^{-5}$ torr(GP)). In ion source 16, the voltage, or indirectly the electric field, is maintained between an anode and a cathode with circuitry configured for current limited mode, with the cathode at ground potential. Due to the cathode being at ground potential, the anode voltage with respect to ground defines the plasma potentials for the ion energy. In the ion extraction process, the ions inside ion source 16 float at a plasma potential typically about +10 volts above the anode voltage.

These positive ions subsequently accelerate down the "potential hill" as they are pulled by a grounded grid structure. The emerging ions from the grid structure are the extracted ions. The extraction aperture can be a single grid system made of 304 stainless steel, with a mesh size of 20, and a wire width of approximately 0.014 inches.

The diameter of the flat extraction aperture is approximately 2 inches. Extracted ion energy, however, deviates significantly from the plasma energy. For ion source 16, the extraction ion energy is about 340 eV, for a plasma potential of about 550 volts. This variation is in part due to the dependence of the extracted ion energy on the physical geometry of the extraction grid and the anode ring, since this geometry dictates the shape of the equal potential planes outside ion source 16. The ion beam flux for the densification of metal oxides is approximately $5.4 \times 10^{14}$ molecules/$cm^2$ second, as shown in FIGS. 5 and 6.

Neutralizer 30 provides ion beam neutralization. This is also referred to as space/charge neutralization. In space/charge neutralization, free electrons are allowed to mix with molecular ions without being captured by the electronic shell of the ions. Thus, the injection of free electrons into the ion beam produces a beam of flowing plasma.

A schematic of neutralizer 30 is shown in FIG. 10. A suitable neutralizer 30 is a filamentless plasma bridge neutralizer ("FPBN") available from Nordiko, Ltd. The operational principle of neutralizer 30 is very similar to that of ion source 16. A neutral gas, including but not limited to, argon, is injected and ionized by a strong electric field. The major difference in operation principles between neutralizer 30 and ion source 16 is in voltage polarity. Because the function of neutralizer 30 is to generate and emit electrons, the inner high voltage electrode is biased negatively, typically about 500 volts, with respect to ground while the outer electrode, in this case the plasma containment housing, is biased less negatively, approximately 24 volts, with respect to ground. The inner high negative voltage is controlled via a current limited mode of about 350 mA. Therefore, electrons of the argon plasma accelerate from a low to a high voltage gradient because the plasma potential is less than zero (negative value). The accelerated electrons then exit neutralizer 30 and mix with the positive ion beam from ion source 16. This mixing of the electrons and ions, or space-charge neutralization, is further facilitated by the fact that the extracted ion beam has a positive plasma potential. The formation of this positive potential just outside, e.g., adjacent to, neutralizer 30 creates a potential gradient with respect to the negative plasma potential inside neutralizer 30. Electrons therefore accelerate through this potential gradient.

Referring now to FIGS. 11 and 12, neutralizer 30 is shown in greater detail. As illustrated in FIG. 11, neutralizer includes a neutralizer can, 32. Also included are the following: (i) high voltage electrode connection 34, (ii) gas inlet 36, (iii) front extraction plate 38, and (iv) an extraction aperture 40.

Referring now to FIG. 12, the physical positioning of neutralizer 30 and ion source 16 is illustrated. Neutralizer 30 includes an electron beam axis which intersects an ion beam axis where there is a high positive charge. Essentially, electrons are drawn to neutralize the high positive charge. Electron beam axis can vary from 15 to approximately 20 degrees off electron beam axis, which is substantially perpendicular to neutralizer 30.

Referring now to FIG. 13, vacuum chamber can be a model no. 7110 vacuum chamber commercially available from Balzars. It is equipped with a Leybold dry vac 100 beam mechanical pump and a 10 inch Balzars cryopump. The pumping speed of the system at high vacuum is about 2300 liters/second (for oxygen gas at 26 degrees centigrade, and FC flow of 15 sccm, chamber pressure of $8.0 \times 10e_{-5}$ torr GP). As electron beam gun 14 outgasses, the vacuum is pulled within vacuum chamber 10. Then oxygen and argon are introduced through oxygen and argon conduits, respectively. The oxygen and argon sources are at approximately 14 psi, and the oxygen introduced into vacuum chamber is at approximately $7.0 \times 10^{-5}$ tor. With argon beam at $4.0 \times 10_{-5}$ tor.

Coating process procedures and parameters used in the method of the present invention are as follows:

SUBSTRATE CLEANING PROCESS

The sequence of the cleaning procedure is:

(i) hand wash and microsoap, plus deionized water solution using cotton pads;

(ii) soak in ultrasonic bath consisting of microsoap and deionized water for 10 minutes;

(iii) soak in cascaded deionized water baths (3 levels) for 10 minutes at each level; and (iv) spin dry.

TARGET MATERIAL PLUG PREPARATION (i) Raw material in the form of metal oxide is baked or heated using electron beam gun 14. The heating of the material continues until a molten pool forms on the target surface and plug outgassing is reduced. This typically requires an emission current of about 0.4 to 0.6 amperes at 7 kV acceleration voltage. Plug outgassing is measured by observing the increase in the chamber pressure at evaporation emission current. The outgassing level is deemed acceptable when vacuum chamber 10 has a pressure change before and during evaporation that is less than about 15 percent. This type of monitoring for outgassing is made possible through manual oxygen gas feed, where total chamber pressure is not held constant via a feedback loop.

(ii) Step 1 is repeated, after raw material replenishment, until the target plug is fully formed to fill an entire 15 cc crucible pocket.

ION PRECLEANING OF UNCOATED SUBSTRATES

Reactive ion precleaning or etching of uncoated substrates is accomplished just prior to the start of the coating deposition. With substrates loaded in carrier 20 in a high vacuum, reactive ion precleaning with oxygen is performed using ion source 16 and neutralizer 30. Reactive oxygen ion precleaning is effective over a large range of ion impingement angles, since the process relies on chemical interactions rather than on a physical process. This reactive process is especially effective in removing complex hydrocarbon contaminations from the substrate surface. In a reactive oxygen environment, hydrogen layers are fragmented, yielding volatile species such as $CO_2$. The following are the process parameters for ion precleaning:

(i) Ion source 16 current: 400 mA;

(ii) Neutralizer 30 cathode current: 350 mA;

(iii) Oxygen partial pressure: $7.0 \times 10^{-5}$ torr GP for ion source 16;

(iv) Argon partial pressure: $4.0 \times 10^{-5}$ torr GP for neutralizer 30;

(v) Relative chamber temperature: 200 degrees centigrade;

(vi) Cleaning duration: 1 minute.

COATING PROCESS PARAMETERS

Prior to the start of coating deposition, ion source 16 and neutralizer 30 are activated to preset parameters. In order to achieve preset voltage and current values, it is first necessary to establish the flow of process gasses. This is required since gas flow, for a current limited operation, controls anode for ion source 16, and cathode for neutralizer 30, voltages. The coating deposition process parameters are as follows:

(i) Coating temperature: 200 degrees centigrade;

(ii) Oxygen partial pressure: $7.0 \times 10^{-5}$ torr GP;

(iii) Argon partial pressure: $4.0 \times 10^{-5}$ torr GP;

(iv) Ion source drive current: 400 mA;

(v) Neutralizer 30 cathode current: 350 mA.

REFRACTIVE INDEX RESULTS FOR SELECTED COATINGS

The refractive index obtained for various coatings is as follows:

(i) $SiO_2$ at 500 nm;

(ii) Refractive index: 1.46;
  Under refractive index deposition rate: 2.3 angstroms/second (6 min/qwot);

(iii) $HfO_2$ at 500 nm: Refractive index: 2.10;
  Under refractive index deposition rate: 0.5 angstroms/second (18 min/qwot);

(iv) $Ta_2O_5$ at 500 nm: Refractive index: 2.15;
  Deposition Rate: 0.5 angstroms/sec (18 min/qwot);

(v) $ZrO_2$ at 500 nm: Refractive Index: 2.20;
  Deposition Rate: 0.5 angstroms/sec (18 min/qwot);

(vi) $TiO_2$ at 500 nm: Refractive Index: 2.65;
  Deposition Rate: 0.3 angstroms/sec (25 min/qwot).

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for coating a substrate with a dielectric coating material, comprising;

providing a high vacuum chamber including a substrate carrier device, an electron beam gun, the substrate, an evaporant source of the dielectric coating material and an ion gun;

evaporating the dielectric coating material with the electron beam gun to form a dielectric coating material evaporant that is directed to the substrate;

directing the ion gun toward the substrate and producing ions that arrive substantially simultaneously with the dielectric coating material evaporant at the substrate, the ions providing a momentum assist to the dielectric coating material evaporant; and forming a dielectric optical coating on the substrate at a deposition rate less than or equal to about 2.3 Angstroms per second so the coating has a low optical loss of 100 ppm or less.

2. The method of claim 1, wherein a plurality of dielectric thin films of the dielectric coating material is formed on the substrate.

3. The method of claim 1, further comprising:
controlling a stoichiometry of the dielectric optical coating formed on the substrate.

4. The method of claim 1, further comprising:
controlling an ion/dielectric coating material evaporant arrival ratio at the substrate to create a desired density of the dielectric optical coating.

5. The method of claim 1, wherein an energy of the dielectric coating evaporant material deposited on the substrate is greater than 5 eV.

6. The method of claim 1, wherein an energy of the dielectric coating material evaporant deposited on the substrate is greater than 7.5 eV.

7. The method of claim 1, wherein an energy of the dielectric coating material evaporant deposited on the substrate is greater than 9.0 eV.

8. The method of claim 1, wherein an energy of the dielectric coating material evaporant deposited on the substrate is 10.0 eV or greater.

9. The method of claim 1, wherein the dielectric optical coating has a low optical scatter of less than 50 ppm.

10. The method of claim 1, wherein the ion gun produces positively charged particles along a longitudinal axis of the ion gun at an exterior of the ion gun.

11. The method of claim 10, wherein the high vacuum chamber includes a plasma beam neutralizer that produces a plurality of electrons which mix with the positively charged particles along the longitudinal axis of the ion gun at the exterior of the ion gun, producing a beam of flowing plasma.

12. The method of claim 11, wherein the plasma beam neutralizer is a filamentless plasma bridge neutralizer.

13. The method of claim 1, wherein the ion gun is a cold cathode ion gun.

14. The method of claim 1, wherein the dielectric coating material is an oxide.

15. The method of claim 14, wherein the oxide is selected from the group, $SiO_2$, $HfO_2$, $Ta_2O_5$, $ZrO_2$, $TiO_2$, $Nb_2O_5$, $Y_2O_3$, $Al_2O_3$, $Se_2O_3$, BeO and $Gd_2O$.

16. The method of claim 1, wherein the dielectric coating material is a metal fluoride.

17. The method of claim 1, wherein the dielectric coating material is a metal carbide.

18. The method of claim 1, wherein the dielectric coating material is a metal nitride.

19. The method of claim 1, wherein the deposition rate is less than or equal to about 0.5 angstroms per second.

20. The method of claim 1, wherein the deposition rate is less than or equal to about 0.3 angstroms per second.

21. A method for coating a substrate with a dielectric coating material, comprising:

providing a high vacuum chamber including a substrate carrier device, an electron beam gun, the substrate, an evaporant source of the dielectric coating material, a plasma beam neutralizer that produces a plurality of electrons and an ion gun producing positively charged particles along a longitudinal axis of the ion gun;

positioning the plasma beam neutralizer adjacent to and in a lateral direction relative to the ion gun longitudinal axis;

generating the plurality of electrons from the plasma beam neutralizer which mix with the positively charged particles along the longitudinal axis of the ion gun, producing a beam of flowing plasma;

evaporating the dielectric coating material with the electron beam gun to form a dielectric coating material evaporant that is directed to the substrate; providing a momentum assist from the beam of flowing plasma to the dielectric coating material evaporant; and forming a dielectric optical coating on the substrate at a deposition rate less than or equal to about 2.3 Angstroms per second so the coating has a low optical loss of 100 ppm or less.

22. The method of claim 2, wherein a plurality of dielectric thin films of the dielectric coating material is formed on the substrate.

23. The method of claim 21, further comprising:

controlling a stoichiometry of the dielectric optical coating formed on the substrate.

24. The method of claim 21, further comprising:

controlling in the plasma an arrival ratio of electrons/dielectric coating material evaporant.

25. The method of claim 21, wherein the beam of flowing plasma increases an energy of the dielectric coating material evaporant deposited as the dielectric optical coating.

26. The method of claim 21, wherein an energy of the dielectric coating material evaporant deposited on the substrate is greater than b 5eV.

27. The method of claim 21, wherein an energy of the dielectric coating material evaporant deposited on the substrate is greater than 7.5 eV.

28. The method of claim 21, wherein an energy of the dielectric coating material evaporant deposited on the substrate is greater than 9.0 eV.

29. The method of claim 21, wherein an energy of the dielectric coating material evaporant deposited on the substrate is 10.0 eV or greater.

30. The method of claim 21, wherein the dielectric optical coating has a low optical scatter of less than 50 ppm.

31. The method of claim 21, wherein the ion gun produces the positively charged particles along the longitudinal axis of the ion gun at an exterior of the ion gun.

32. The method of claim 21, wherein the plasma beam neutralizer is a filamentless plasma bridge neutralizer.

33. The method of claim 21, wherein the ion gun is a cold cathode ion source.

34. The method of claim 21, wherein the dielectric coating material is an oxide.

35. The method of claim 34, wherein the oxide is selected from the group, $SiO_2$, $HfO_2$, $Ta_2O_5$, $ZrO_2$, $TiO_2$, $SiO_2$, $HfO_2$, $Ta_2O_5$, $ZrO_2$, $TiO_2$, $Nb_2O_5$, $Y_2O_3$, $Al_2O_3$, $Se_2O_3$, BeO and $Gd_2O$.

36. The method of claim 21, wherein the dielectric coating material is a metal fluoride.

37. The method of claim 21, wherein the dielectric coating material is a metal carbide.

38. The method of claim 21, wherein the dielectric coating material is a metal nitride.

39. The method of claim 21, wherein the deposition rate is less than or equal to about 0.5 angstroms per second.

40. The method of claim 21, wherein the deposition rate is less than or equal to about 0.3 angstroms per second.

* * * * *